United States Patent [19]

Degani

[11] Patent Number: 5,385,290
[45] Date of Patent: Jan. 31, 1995

[54] SOLDERING MATERIAL AND PROCEDURE

[75] Inventor: Yinon Degani, Highland Park, N.J.

[73] Assignee: AT&T Corp., Murray Hill, N.J.

[21] Appl. No.: 158,131

[22] Filed: Nov. 24, 1993

[51] Int. Cl.⁶ .............................................. B23K 31/02
[52] U.S. Cl. .............................. 228/180.22; 228/248.1
[58] Field of Search ............. 228/180.22, 248.1, 248.5; 148/24

[56] References Cited

U.S. PATENT DOCUMENTS

| | | | | |
|---|---|---|---|---|
| 4,509,994 | 4/1985 | Barajas | ................................. | 148/24 |
| 4,531,986 | 7/1985 | Barajas | ................................. | 148/24 |
| 4,731,130 | 3/1988 | O'Leary | ................................. | 148/24 |
| 4,740,252 | 4/1988 | Hasegawa et al. | ................................. | 148/24 |

OTHER PUBLICATIONS

Tummala, R. R., *Microelectronics Packaging Handbook*, pp. 366–391 and 819–836, Van Nostrand Reinhold, New York, N.Y. (1989).

Hwang, J. S., *Solder Paste in Electronic Packaging*, pp. 172–174 and 180–181, Van Nostrand Reinhold, New York, N.Y. (1989).

Johnson, C. C. et al., *Solder Paste Technology*, pp. 42–47, TAB Booke Inc., Blue Ridge Summit, Pa. (1989).

Hwang, J. S., *Solder Paste in Electronic Packaging*, pp. 91–99, Van Nostrand Reinhold, New York, N.Y. (1989).

*Primary Examiner*—Kenneth J. Ramsey
*Attorney, Agent, or Firm*—Bruce S. Schneider

[57] ABSTRACT

The quality of soldering produced on devices such as printed circuit boards and multichip modules is significantly improved through use of a specific size distribution of solder particles. In particular, the solder includes a vehicle and solder particles of specific size. In general, an appropriate distribution of both large and small particles should be employed. Through this expedient short circuits and soldering defects in fine line devices are reduced.

5 Claims, 1 Drawing Sheet

SOLDERING MATERIAL AND PROCEDURE

BACKGROUND OF THE INVENTION

1. Field of the Invention

This invention relates to devices requiring soldering of a component to a substrate and, in particular, devices soldered using a solder paste.

2. Art Background

Many electronic devices are formed by soldering components onto a substrate. Exemplary of such devices arc printed circuit boards, multichip modules, and hybrid integrated circuits. (See R. R. Tummala et al, *Micoelectronics Packaging Handbook*, pp. 366–391 and 819–836, Van Nostrand Reinhold, New York, N.Y. (1989), for a review of typical devices formed using soldering techniques and the soldering techniques employed.) In each device, electrical conducting, e.g., metallic, interconnect lines are formed on a substrate and used to provide the required electrical interconnections between component leads.

A variety of ways are available to apply the solder onto the metallic interconnect line where the component is to be soldered. For example, one conventional approach involves soldering to a component whose leads are deposed through a hole in the circuit board. A second procedure involves surface mounting of components. In leadless surface mounting, metal regions on the bottom of the component are aligned and soldered to corresponding pads on the metallized interconnect lines. Similarly, in leaded surface mounting, metal tabs on the components are soldered to corresponding pads on the interconnect. Another approach is commonly denominated flip-chip technology and involves positioning metallized regions on unpackaged component and corresponding pads on the metallized interconnects that are to be electrically connected to the corresponding pads on the component. In some flip-chip applications, the metallized regions on the component and on the interconnects are prebumped with solder prior to the assembly.

Irrespective of soldering approach, the solder applied between the component and the interconnect substrate typically includes both a vehicle and dispersed solder—typically particles. (A solder material is considered a metallic alloy with melting point lower than 35° C., and a vehicle is considered a medium that maintains the particles of the solder material in a cohesive mass; allows their dispension; and promotes the fusion of the solder particles when heated to the melting point.) The combination of the vehicle and solder particles into a dispersion yields a paste. The paste is applied to the component and to the substrate interconnects in a variety of ways. One particularly advantageous approach involves the application of the paste through a stencil with openings corresponding to the regions upon which paste is desired. This approach is advantageous because it is relatively inexpensive and is expeditiously performed. Other approaches for applying the paste include pneumatic dispensing; or pin transfer, as disclosed in J. S. Hwang, *Solder Past in Electronic Packaging*, pp. 172–174 and 180–181, Van Nostrand Reinhold, New York, N.Y. (1989).

Even if the solder paste is applied precisely to the interconnect regions where solder is desired, problems are still possible. For example, when the devices are placed on the paste, the solder paste can spread from one interconnect metallic line to an adjacent line across the intervening dielectric substrate portion. Upon reflow, this may lead to a solder "bridge" between these lines. This intrusion of solder from one interconnect line to a second produces a short circuit which is unacceptable. Alternatively, the spread solder paste may segregate upon reflow between adjacent interconnect lines and produces one solder connection with an excess of solder and one starved of solder. The latter condition often presents reliability problems. Similarly, solder paste on pads close to the edge of the component can be extruded from under the component (FIG. 1 left side paste, 3, extruded from under component 2) and thus yield, upon reflow, a solder starved joint and solder debris both of which are considered reliability problems.

The most common approach for solving this difficulty has generally been to space interconnect lines sufficiently far apart that such short circuits do not occur. However, the objective in device fabrication has long been to increase the density of the components electrically interconnected on a substrate. Therefore, an increase in a metallic line spacing is not a desirable solution to the difficulties associated with soldering on fine line devices.

SUMMARY OF THE INVENTION

Use of fine interconnect spacings, i.e., spacings less than 25 mils between metallic interconnect lines, is possible by the use of specific size distributions of solder particles in the solder paste being employed. Generally, the paste should include solder particles falling within two geometric sizes. (The size of a particle in the context of this invention is described in terms of its effective diameter and this diameter is the diameter of a sphere having the same volume as the particle whose diameter is to be determined.) The first grouping size are relatively large particles that prevent the component, when applied to the substrate, from applying compressive force to the paste, thus preventing a concomitant spreading of the paste. For example, as shown in FIG. 1, the paste is initially applied, and if large particles are not present after positioning of the component, the paste is forced outward, 3, from the component. 2, to an adjacent interconnect. Therefore, use of large particles, 1, is extremely important in preventing short circuits and uneven distribution of paste due to squeeze out from component, 4.

However, use of all large particles is not a total solution. If only large particles are employed, then the definition of the paste being printed degrades. Therefore, a combination of 1) particles classifiable as large with 2) particles classifiable as small, is employed to produce extremely desirable results. In one example, particles having an average size of 75 $\mu$m mixed with particles having an average size of 30 $\mu$m were printed on a substrate to form a 9 mil diameter, 3 to 4 mil high, paste deposit over 6 mil diameter pads placed at 13 mil centers. Solder reflow yields electrical interconnects without shorts between lines. The invention has advantages in multichip module application and, in particular, where the active connects for an integrated circuit are soldered directly to a substrate (flip-chip geometry).

BRIEF DESCRIPTION OF THE DRAWINGS

The FIGURE is illustrative of geometries relating to soldering processes.

DETAILED DESCRIPTION

Figure 1:
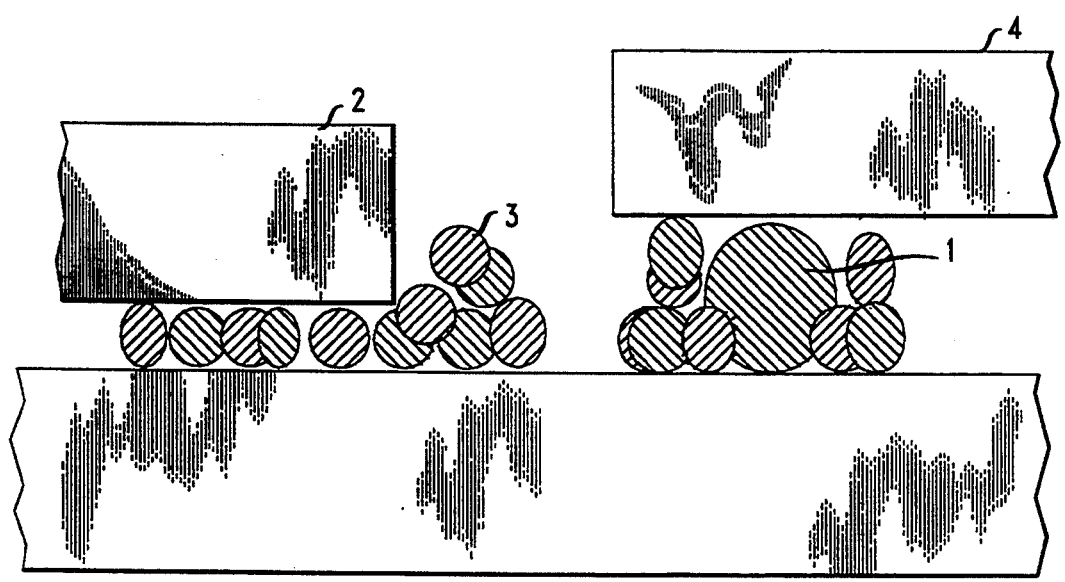

As discussed, the inventive procedure and solder paste employ particles dispersed in a vehicle where the particles occupy two geometric size groups. The composition of the vehicle is not critical. Typical composition of vehicles for stencil application of the paste are described in C. C. Thomson, et al., *Solder Paste Technology*, pp. 42–47, TAB Booke Inc., Blue Ridge Summit, Pa. (1989). Generally, the particles should represent 35 to about 65 volume % of the paste with the remainder of the volume being vehicle including any additives.

The finer the small particles, the better the definition of the print. However, if the particles are excessively small, it is not desirable because their associated large surface area leads to unacceptable oxidation of the solder in a given volume of solder paste. Generally, the average diameter of the small particles should be greater than 20 $\mu$.

The size or diameter ($D_{big}$) of the large solder particles and volume fraction of the big balls ($f_{big}$) in the solder powder used in the paste is determined by a relatively simple relation. For a given application tier which a desired volume ($V_{dep}$) of solder paste deposit is required, an average of n large size solder balls are needed in each deposit to insure the compression resistance. Considering the volume fraction of the solder in the paste ($f_{paste}$), and the volume of each big solder ball to be ($V_b$), then $$V_b = \frac{4}{3} \pi R_b^3 = \frac{V_{dep} \times f_{paste} \times f_{big}}{n}$$

and $$D_{big} = 2R_{big} = 2 \left( \frac{3}{4} \frac{V_{dep} \times f_{paste} \times f_{big}}{\pi \cdot n} \right)^{\frac{1}{3}}$$

Exemplary of typical parameters for the exemplary conditions of $f_{paste} = 0.5$
$f_{big} = 0.25$
$n = 1.5$ and for a cylindrical deposition of 10 mil diameter and 4 mil height, are $$V_{dep} = 5^2 \pi \times 4$$

$$D_{big} = 2 \left( \frac{3}{4} \frac{5^2 \pi \times 4 \cdot 0.5 \times 0.25}{\pi \cdot 15} \right)^{\frac{1}{3}} = 3.68 \text{ mil.}$$

Generally, the deposited paste should have a height, h, where $h \geq D_{big} \geq 60\% (h)$ and a width generally corresponding to the pad to be soldered. $V_{dep}$ is typically on the order of 100 to 1000 cubic mils for applications such as multichip modules and 2,000 to 20,000 cubic mils for surface mount applications. Clearly, the volume employed depends strongly on the application and useful amounts vary between 100 and 20,000 cubic mils. Additionally, the fraction of the big particles employed depends on the fineness of the pitch between adjacent pads to be soldered. For pitches liner than 19 mils, the $f_{big}$ should be less than 0.5. For pitches larger than 19 mils, $f_{big}$ is acceptable if smaller than 0.66. In either case, n should be larger than 0.5. A solder ball is considered large when its effective diameter is within 20% of $D_{big}$. The small solder particles should generally have an effective diameter less than 60% of $D_{big}$, preferably 50% of $D_{big}$, most preferably 40% of $D_{big}$. If the calculated $D_{big}$ is larger than h, the value used for actual $D_{big}$ still must be within the range $h > D_{big} > 60\% (h)$. Particles of appropriate size and description are easily formed in accordance with conventional techniques such as described in J. S. Hwang, supra, pp. 91–99. Mixing of the particles as well as mixing of the entire particle mass with the vehicle is accomplished by conventional techniques such as interdispersion in a conventional mixer. Typical processing conditions include application of the component to the substrate that has been previously printed with solder paste followed by a gradual increase of the temperature over 3–6 minutes to a temperature of 10°–30° C. below the melting point of the solder alloy. The temperature is then generally raised to and above the melting point of the solder and maintained in this range for a period of 15 to 60 seconds with peak temperature about 30° C. above the melting point. Population of components onto the substrate is accomplished by typical techniques including surface mount technology.

The following example is illustrative of the invention.

EXAMPLE 1

An array of 104 Si on Si MCMs was assembled by printing solder paste on the contacting pads of the Si water substrate and placing Si chips, that had corresponding pads, onto the paste and then heating the resulting structure above the melting point of the solder and cooling the assembled wafer to room temperature. Each MCM module had four Si Chips. Each chip had a different array of metallized pads measuring 6 mil in the diameter. The arrays were of 12, 16, 19, and 20 pads with pitches of 13, 15, 20, and 18 mils, respectively. The solder paste used was composed of 11 wt % rosin based flux, 22 wt % large solder particles with average diameter of 2.6 mils. and 67 wt % of line solder particles with average diameter of 1.2 mils. The solder paste was printed on the substrate Si wafer through 9 mil diameter openings in a 3 mil thick stainless steel stencil.

I claim:

1. A method for soldering two bodies at at least one contact position using a volume of solder paste, $V_{dep}$, at said contact position wherein said solder paste comprises solder particles and a vehicle, said particles being 35 to 65 volume % of said paste characterized in that at least 34% but less than 100% of the total volume of said particles is made up of small particles with the remainder being big particles wherein said big particles are solder particles having an effective diameter within 20% of a diameter, $D_{big}$, in the range $h > D_{big} > 60\%$ h where h is the height of the deposited volume $V_{dep}$.

2. The method of claim 1 wherein at least 50% but less than 100% of the total volume of said particles is made of small particles.

3. The method of claim 1 wherein one of said bodies comprises an integrated circuit.

4. The method of claim 1 wherein said bodies are contacted to a substrate to form a multichip module.

5. A method of claim 1 wherein $D_{big}$ is further the smaller of h and $$2 \left( \frac{\frac{3}{4} V_{dep} \times f_{paste} \times f_{big}}{\pi \cdot n} \right)^{\frac{1}{3}}$$

where $f_{paste}$ is the volume factor of said solder particles in said paste, $f_{big}$ is the volume factor of said big particles of said particles and n is greater than 0.5.

* * * * *